United States Patent [19]

Guajardo

[11] 4,339,670
[45] Jul. 13, 1982

[54] ZERO VOLTAGE SWITCHING AC RELAY CIRCUIT

[75] Inventor: Ciro Guajardo, Harbor City, Calif.

[73] Assignee: Teledyne Industries, Inc., Los Angeles, Calif.

[21] Appl. No.: 164,224

[22] Filed: Jun. 30, 1980

[51] Int. Cl.³ ............................................. H03K 17/72
[52] U.S. Cl. ............................. 307/252 A; 307/252 T; 307/311; 307/252 VA; 323/320
[58] Field of Search .......... 307/252 R, 252 A, 252 N, 307/252 T, 252 VA, 311; 323/320, 349, 350, 319

[56] References Cited

U.S. PATENT DOCUMENTS 3,816,763 6/1974 Korn et al. ...................... 307/252 A Primary Examiner—John Zazworsky
Attorney, Agent, or Firm—Reagin & King

[57] ABSTRACT

An improved zero voltage switching AC relay circuit is disclosed which includes two photo sensitive silicon controlled rectifiers (photo-SCRs) connected in inverse parallel as the active switching elements. The photo-SCRs are triggered into conduction by a light source including two light emitting diodes. Zero voltage switching circuitry is also provided which prevents the photo-SCRs from being triggered into conduction by the light source except when the value of the AC voltage being controlled is within a predetermined limit of zero volts. This is accomplished by using the collector-emitter circuit of a transistor to shunt the gate-cathode circuit of each photo-SCR. A transistor is provided for each photo-SCR, and the bases of the transistor are connected to each other by a single current limiting resistor.

4 Claims, 1 Drawing Figure

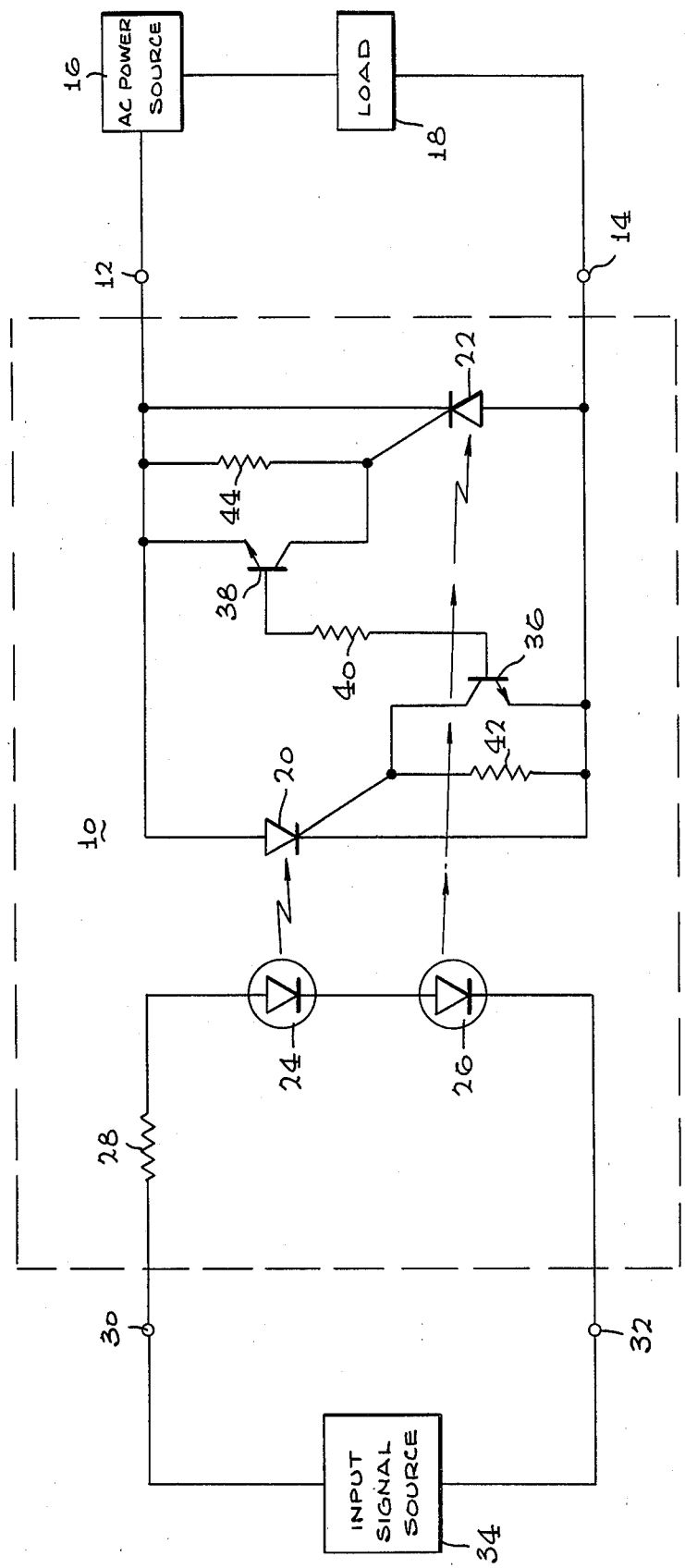

ZERO VOLTAGE SWITCHING AC RELAY CIRCUIT

BACKGROUND OF THE INVENTION

This invention relates to relay circuits and, more particularly, to a relay circuit for controlling an AC voltage which utilizes a pair of photo sensitive silicon controlled rectifiers, hereinafter referred to as photo-SCRs, as the active switching elements and which includes means for triggering the photo-SCRs into conduction only when the value of the AC voltage being controlled is within predetermined limits of zero volts.

A photo-SCR is a type of semiconductor control switch which may be triggered into conduction by a gate signal in a manner similar to the action of the well known conventional silicon controlled rectifier (SCR). However, the photo-SCR differs from the conventional SCR in that the photo-SCR may be triggered into conduction by radiant photo energy incident on the photo-SCR, as well as by conventional means of applying an external electrical signal to the photo-SCR gate. The radiant energy in turn may be generated by a light source such as a light emitting diode (LED). Since SCR devices conduct only in one direction, two photo-SCRs connected in inverse-parallel may be employed for full wave control in AC circuits.

A number of circuits have been devised in the prior art to provide an AC relay consisting of a pair of inverse-parallel connected photo-SCRs triggered into conduction by LED light sources which are optically coupled to the SCRs through a transparent dielectric path. The LEDs are in turn energized by an input signal. The light output from the LED light source impinges on the photo-SCRs, causing them to conduct and complete an output circuit between an AC power source and a load. Such relay circuits are widely used for the control of AC loads by computer generated logic signals such as are found in microcomputer based control systems. The optical coupling between the input signal circuit and the load circuit provides excellent electrical isolation between the logic signals and the AC loads. In addition, the photo-SCR relay circuit thus described requires few components for its implementation. This circuit simplicity permits the use of hybrid circuit construction techniques for the manufacture of these devices. As is well known to those skilled in the art, such construction techniques may employ ceramic substrates and lead frames to support the semiconductor chips with the resultant assembly being molded in plastic. The use of these construction techniques provides a solid state AC relay circuit which may be inexpensively mass produced in a very small package size.

Although the prior art photo-SCR AC relay circuits have gained widespread use, they possess several limitations. For example, it is well known that for most applications it is desirable to have an AC relay which switches on only at those points in time when the value of the AC voltage being controlled is substantially equal to zero. This eliminates the transient problems which occur if the relay is switched on at an instant when the AC voltage being controlled has a substantial value. This type of circuit action is known to those skilled in the art as zero voltage switching, although the actual switching action may occur within a range of voltages around zero.

Several circuits have been devised in the prior art to provide zero voltage switching for AC relays using photo-SCRs. However, such circuits possess several limitations. Many of these zero voltage switching circuits employ a large number of components to achieve acceptable performance. These circuits have not gained widespread use because they negate the ease of construction, small size and low cost advantages of the basic nonzero voltage switching photo-SCR circuits. In an effort to provide a zero voltage switch circuit using a minimum number of components, prior art designs have employed a transistor having its collector and emitter connected to the photo-SCR gate and cathode respectively. The transistor base is connected through a series current limiting resistor to the photo-SCR anode. The photo-SCR anode-cathode voltage is thus used to control the transistor. The object of this circuit is to use the transistor to clamp the gate-cathode circuit of the photo-SCR whenever the voltage across the photo-SCR anode-cathode circuit exceeds a predetermined value. Clamping the photo-SCR gate-cathode circuit prevents the photo-SCR from being triggered into conduction, even if there is radiant photo energy incident on the photo-SCR.

Unfortunately, the SCR gate clamping circuit thus described has the effect of significantly increasing the level of irradiance required to trigger the photo-SCR into conduction. This level of irradiance is a measure of the intensity of the photo energy incident on the photo-SCR that is required to trigger the SCR into conduction. A significant increase in the level of irradiance requires a corresponding increase in the light output of the light source used to trigger the photo-SCRs into conduction. In the case of an LED light source, an increase in light output is accomplished by an increase in the LED current supplied by the input signal source. Accordingly, it has been found that prior art AC relay circuits employing the zero voltage switching configuration described heretofore require high levels of input signal current for their operation. These high levels of input current preclude the prior art zero voltage switching AC relay circuits from being directly controlled by computer generated logic signals. As indicated previously, a major application of these AC relay circuits is as a direct interface between computer logic and AC loads. Computer logic circuits are limited in the amount of current they can supply to drive the input of the AC relay circuit. By exceeding these logic current levels, additional amplifiers and power drivers are required to interface the prior art relay circuits to the computer logic. Additional power supplies may also be required to supply the increased current levels.

The requirement for higher levels of light output in prior art circuits causes an additional disadvantage. It is well known to those skilled in the art that LEDs exhibit a phenomenon known as output degradation. That is, the light output of an LED decreases with time. The rate of degradation of light output is a function of the LED current level, with higher LED currents producing faster degradation. Thus an AC relay circuit requiring a high level of light output and therefore a high level of LED current exhibits a rapid degradation of performance.

It is therefore an object of the present invention to provide a new and improved zero voltage switching AC relay circuit.

It is another object of the present invention to provide an improved zero voltage switching AC relay circuit which does not require high levels of input current for operation.

It is still another object of the present invention to provide a simple and inexpensive zero voltage switching AC relay circuit which may be constructed with a minimum number of components.

SUMMARY OF THE INVENTION

The foregoing and other objects of the invention are accomplished by providing an alternating current relay circuit which includes two photo-SCRs as the active switching elements. The two photo-SCRs are connected in inverse parallel to provide full wave control. The AC voltage to be controlled is applied to the parallel connection of the two photo-SCRs. The photo-SCRs are triggered into conduction by a light source positioned adjacent to and optically coupled with the photo-SCRs. The light source includes two light emitting diodes connected to an input signal source.

Zero voltage switching circuitry is also provided which prevents the photo-SCRs from being triggered into conduction by the light source except when the value of the AC voltage being controlled is within a predetermined limit of zero volts. This is accomplished by using the collector-emitter circuit of a transistor to shunt the gate-cathode circuit of the photo-SCR. A transistor is provided for each photo-SCR. The bases of the transistors are connected to each other by a single current limiting resistor. This circuit configuration relies on the emitter-base breakdown voltage of each transistor to set a predetermined zero voltage switching level and results in a zero voltage switching AC relay circuit which does not require high levels of input current for operation.

Other objects, features, and advantages of the invention will become apparent from a reading of the specification when taken in conjunction with the drawing.

BRIEF DESCRIPTION OF THE DRAWING

The sole FIGURE is a circuit diagram of a zero voltage switching AC relay circuit constructed in accordance with the invention.

DESCRIPTION OF THE PREFERRED EMBODIMENT

Referring to the FIGURE there is shown a zero voltage switching AC relay circuit 10 constructed in accordance with the invention. As shown therein, the relay circuit includes a pair of output terminals 12 and 14 which are connected in series with a source 16 of the AC voltage to be controlled and the load 18 to which the voltage is to be applied. In its usual application the function of the relay circuit is to provide an effectively open circuit between the output terminals 12 and 14 when the relay is not actuated, thereby preventing the application of the voltage 16 to the load 18, and to provide an effectively short circuit between the output terminals 12 and 14 when the relay is actuated, thereby allowing the AC voltage from the source 16 to be connected through the relay circuit to the load 18.

The active switching elements in the relay circuit are two photo-SCRs 20 and 22. The photo-SCRs 20 and 22 may be triggered into conduction by applying an external gate signal in a manner similar to the action of the well known conventional SCR. In addition, the photo-SCRs 20 and 22 may be triggered into conduction by radiant photo energy incident on the photo-SCR. When the photo-SCRs 20 and 22 are triggered into conduction they provide a low impedance path for current flow from anode to cathode, while maintaining a nonconducting state in the reverse direction from cathode to anode. By connecting the two photo-SCRs 20 and 22 in inverse parallel, a circuit is formed which can conduct current in either direction and is thus suitable for full wave AC control. Such an inverse connection is shown in the FIGURE where the anode of the photo-SCR 20 is connected to the cathode of the photo-SCR 22 and the cathode of the photo-SCR 20 is connected to the anode of the photo-SCR 22. Assuming that both photo-SCRs 20 and 22 are triggered into conduction, during the positive half cycles of the AC power source 16, when the voltage at the terminal 12 is positive with respect to the voltage at the terminal 14, the load current flows through the anode-cathode circuit of the photo-SCR 20. Conversely, during the negative half cycles of the AC power source 16, the load current flows through the anode-cathode circuit of the photo-SCR 22.

Also shown in the FIGURE are two light emitting diodes (LEDs) 24 and 26 which in the construction of the AC relay circuit 10 are positioned adjacent to and optically coupled with the photo SCRs 20 and 22 respectively. The LEDs 24 and 26 are connected in series with each other and with a current limiting resistor 28 to a pair of input terminals 30 and 32. These input terminals 30 and 32 are in turn connected to an input signal source 34.

The operation of the circuit as discussed thus far may be summarized as follows. When an input signal is applied to the input terminals 30 and 32 from the input source 34, LEDs 24 and 26 generate light which is optically coupled to the photo-SCRs 20 and 22 respectively. The photo energy incident on the photo-SCRs 20 and 22 triggers them into conduction, providing a full wave conduction path from the AC power source 16 to the load 18. When the input signal source 34 is removed, the photo-SCRs are commutated to the nonconducting state by the current reversals of the AC power source 16 in a manner well known to those skilled in the art.

The operation of the circuit thus described permits the input signal source 34 to cause the photo-SCRs 20 and 22 to trigger into conduction at any voltage level of AC source 16. As described above, it is desirable to prevent the relay circuit 10 from being switched on when the AC voltage source 16 has a substantial value. Thus a zero voltage switching function is provided in the relay circuit 10 by transistors 36 and 38 and a current limiting resistor 40. These components 36, 38, and 40 permit triggering the photo-SCRs 20 and 22 into conduction only when the value of the AC voltage source 16 is within predetermined limits of zero volts. The operation of this portion of the circuit is as follows.

The NPN transistor 36 is connected so that its collector and emitter are connected to the gate and cathode respectively of the photo-SCR 20. In like manner, the NPN transistor 38 is connected so that its collector and emitter are connected to the gate and cathode respectively of the photo-SCR 22. The operation of a photo-SCR type device is such that it may be rendered nonresponsive to a light source by shunting the SCR gate-cathode circuit by a low impedance path. Such low impedance paths are provided for the photo-SCRs 20 and 22 when the transistors 36 and 38 are biased into conduction. By ensuring that the transistors 36 and 38 are biased into conduction whenever the AC voltage source 16 exceeds predetermined voltage limits, the photo-SCRs 20 and 22 are prevented from being triggered into conduction except within these predetermined voltage limits, thus performing the zero voltage switching function.

In the prior art circuits, the transistors which provide the desired low impedance path are biased into conduction by connecting their respective bases to the anodes of the photo-SCRs through suitable current limiting resistors. Thus, in the prior art circuits, the base of the transistor 36 would be connected through a series resistor to the anode of the photo-SCR 20, and in like manner, the base of the transistor 38 would be connected through a series resistor to the anode of the photo-SCR 22. In this prior art circuit configuration, the transistors are biased into conduction whenever the voltage across the photo-SCRs 20 and 22 exceed the transistor base-emitter voltage drop, typically six-tenths of a volt for silicon transistors. Accordingly, since the voltage across the photo-SCRs 20 and 22 is the voltage of the AC power source 16 when the relay circuit is not conducting, the prior art circuit configuration can be triggered into conduction only when the voltage of the AC power source 16 is less than six-tenths of a volt.

It has been found that high levels of photo energy are required to trigger the photo-SCRs 20 and 22 into conduction when the SCR anode-cathode voltages are less than six-tenths of a volt. As discussed above, these high levels of photo energy required by the prior art circuits result in unacceptable current level requirements from the input signal source 34 to drive the LEDs 24 and 26.

The characteristics of the prior art zero voltage switching AC relay circuits limit their operation when used with high voltage and high frequency AC power sources 16. The AC power source 16 represents a sinusoidal voltage source, and the interval of time during which this sinusoidal voltage is less than six-tenths of a volt is a function of the peak voltage and the frequency of the sinusoid. For example, a one hundred and twenty volt AC, sixty Hz sinusoid is within six tenths of a volt of zero for only twenty microseconds during each half cycle of the sinusoid, and a two hundred twenty volt AC, 400 Hz sinusoid is within six-tenths of a volt of zero for only two microseconds during each half cycle. Since a typical photo-SCR type device has a turn-on response time of approximately ten microseconds, these devices cannot respond fast enough to be triggered into conduction when used with an AC power source 16 having a high peak voltage and a high frequency. Thus the prior art zero voltage switching circuits are restricted to be used within a limited range of AC power sources.

The zero voltage switching AC relay circuit 10 constructed in accordance with the present invention circumvents the limitations of the prior art circuits by employing a single current limiting resistor 40 connected between the bases of the transistors 36 and 38. In this circuit configuration the current flow into the base of either transistor 36 or 38 is supplied by the resistor 40 in series with the emitter-base junction of the opposing transistor. Thus, during positive half cycles of the AC power source 16, the voltage across the anode-cathode circuit of the photo-SCR 20 must exceed the emitter-base breakdown voltage of the transistor 38 before bias current is supplied through the resistor 40 to the base of the transistor 36, causing it to conduct. In like manner during negative half cycles of the AC power source 16, the voltage across the anode-cathode circuit of the photo-SCR 22 must exceed the emitter-base breakdown voltage of the transistor 36 before bias current is supplied through the resistor 40 to the base of the transistor 38, causing it to conduct. The typical emitter-base breakdown voltage of NPN transistors 36 and 38 used in this application is nine volts. Accordingly, the effect of connecting the resistor 40 between the bases of the transistors 36 and 38 is to permit the photo-SCRs 20 and 22 to be triggered into conduction for voltages of the AC power source 16 ranging up to the transistor emitter-base breakdown voltage of nine volts.

It has been found that the photo-SCRs 20 and 22 may be triggered into conduction with low levels of photo energy when the photo-SCR anode-cathode voltage is in the nine volt range, compared to six-tenths of a volt as in the prior art circuits. Typically, only one-third of the current from the input signal source 34 is necessary to operate the zero voltage switching AC relay circuit 10 as compared to the prior art zero voltage switching AC relay circuits.

By providing a nine volt interval for triggering of the photo-SCRs 20 and 22, the time duration available for triggering is also extended. For a given voltage and frequency of the AC power source, the duration of the time during which the sinusoid is within nine volts of zero is fifteen times greater than the time duration for which the sinusoid is within six-tenths of a volt of zero. This increase in time duration for triggering permits the relay circuit 10 to be used with an AC power source 16 having a high voltage and a high frequency. In addition, the relay circuit 10 requires only one base bias resistor 40 compared to a requirement for two base resistors in the prior art circuits described heretofore.

The zero voltage switching AC relay circuit 10 may also include gate-to-cathode resistors 42 and 44 which are connected across the gate-cathode circuit of the photo-SCRs 20 and 22 respectively. The purpose of the resistors 42 and 44 is to prevent the photo-SCRs 20 and 22 from false triggering due to gate leakage current at elevated temperatures.

The invention is thus disclosed and the presently preferred embodiment described in detail. However, it is not intended that the invention be limited solely to this embodiment. Many modifications will occur to those skilled in the art which are within the spirit and scope of the invention. For example, the current limiting function of the resistor 40 might be accomplished by a constant current semiconductor device such as a junction field effect transistor. In addition, although two LEDs 24 and 26 are shown as the light source, it is contemplated that a single LED may also be used, having sufficient surface area to provide radiant photo energy to both photo-SCRs 20 and 22. It is thus intended that the invention be limited in scope only by the appended claims.

What is claimed is:

1. An alternating current relay circuit comprising, in combination:
   first and second output terminals;
   first and second photo sensitive silicon controlled rectifiers;
   means for connecting the anode terminal of the first photo sensitive silicon controlled rectifier and the cathode terminal of the second photo sensitive silicon controlled rectifier to the first output terminal;
   means for connecting the cathode terminal of the first photo sensitive silicon controlled rectifier and the anode terminal of the second photo sensitive silicon controlled rectifier to the second output terminal;
first and second transistors;
means for connecting the collector-emitter circuit of the first transistor to the gate-cathode circuit of the first photo sensitive silicon controlled rectifier;
means for connecting the collector-emitter circuit of the second transistor to the gate-cathode circuit of the second photo sensitive silicon controlled rectifier;
means for connecting a current limiting element between the base terminal of the first transistor and the base terminal of the second transistor, whereby the current limiting element is in series with the emitter-base junction of the first transistor to provide the sole current path for the flow of base bias current from the second output terminal to the base terminal of the second transistor, and whereby the current limiting element is in series with the emitter-base junction of the second transistor to provide the sole current path for the flow of base bias current from the first output terminal to the base terminal of the first transistor, so that the flow of base bias current to the first and second transistors requires the breakdown of the emitter-base junction of the second and first transistors, respectively;
a light source having a light output and positioned so that the light output impinges on the first and the second photo sensitive silicon controlled rectifiers to trigger them into conduction; and
means for connecting the light source to the first and second input terminals.

2. The relay circuit of claim 1 in which the current limiting element includes a base current limiting resistor.

3. The relay circuit of claim 1 in which the light source includes a first light emitting diode connected in series with a second light emitting diode, the diodes positioned so that the light output of the first and second light emitting diodes impinges on the first and second photo sensitive silicon controlled rectifiers, respectively.

4. The relay circuit of claim 1 which further includes first and second gate bypass resistors and means for connecting the first and second gate bypass resistors across the gate-cathode circuits of the first and second photo sensitive silicon controlled rectifiers respectively.

* * * * *